(12) United States Patent
Bollenbeck (10) Patent No.: US 11,656,306 B2
(45) Date of Patent: May 23, 2023

(54) MAGNETIC RESONANCE APPARATUS HAVING A PATIENT COMMUNICATION UNIT AND A METHOD FOR TRANSMITTING AT LEAST ONE COMMUNICATION SIGNAL

(71) Applicant: Siemens Healthcare GmbH, Erlangen (DE)

(72) Inventor: Jan Bollenbeck, Eggolsheim (DE)

(73) Assignee: Siemens Healthcare GmbH, Erlangen (DE)

( * ) Notice: Subject to any disclaimer, the term of this patent is extended or adjusted under 35 U.S.C. 154(b) by 670 days.

(21) Appl. No.: 16/585,336

(22) Filed: Sep. 27, 2019

(65) Prior Publication Data

US 2020/0103479 A1 Apr. 2, 2020

(30) Foreign Application Priority Data

Sep. 27, 2018 (DE) .......................... 102018216644.7

(51) Int. Cl.
| | |
|---|---|
| *G01R 33/36* | (2006.01) |
| *G01R 33/07* | (2006.01) |
| *G01R 33/385* | (2006.01) |
| *G01R 33/34* | (2006.01) |
| *G06T 7/00* | (2017.01) |

(52) U.S. Cl.
CPC ......... *G01R 33/3692* (2013.01); *G01R 33/07* (2013.01); *G01R 33/34038* (2013.01); *G01R 33/3621* (2013.01); *G01R 33/385* (2013.01); *G06T 7/0012* (2013.01); *G06T 2207/10088* (2013.01)

(58) Field of Classification Search
CPC ................ G01R 33/3692; G01R 33/07; G01R 33/34038; G01R 33/3621; G01R 33/385
See application file for complete search history.

(56) References Cited

U.S. PATENT DOCUMENTS

| | | | | |
|---|---|---|---|---|
| 6,718,207 | B2 * | 4/2004 | Connelly | A61N 1/37512 607/9 |
| 6,829,509 | B1 * | 12/2004 | MacDonald | A61N 1/086 600/374 |
| 9,438,981 | B2 | 9/2016 | Brown et al. | |

(Continued)

FOREIGN PATENT DOCUMENTS

| | | |
|---|---|---|
| CN | 103505290 A | 1/2014 |
| CN | 105078458 A | 11/2015 |

(Continued)

OTHER PUBLICATIONS

Jonathan Lu et al., "Evaluation of Common RF Coil Setups for MR Imaging at Ultrahigh Magnetic Field: a Numerical Study", pp. 1-13.*

(Continued)

*Primary Examiner* — Dixomara Vargas
(74) *Attorney, Agent, or Firm* — Banner & Witcoff Ltd.

(57) ABSTRACT

A magnetic resonance apparatus includes a scanner, a patient accommodating region, a patient support apparatus which can be moved within the patient accommodating region and a patient communication device. The patient communication device includes at least one communication element which has a radio-frequency transmitter.

21 Claims, 3 Drawing Sheets

(56) References Cited

U.S. PATENT DOCUMENTS

| | | | |
|---|---|---|---|
| 9,813,149 B2 | 11/2017 | Bollenbeck | |
| 9,985,776 B2 | 5/2018 | Bollenbeck | |
| 2003/0071624 A1* | 4/2003 | Schwarz | G01R 33/283 324/309 |
| 2005/0283068 A1* | 12/2005 | Zuccolotto | A61B 5/055 600/410 |
| 2010/0176809 A1* | 7/2010 | Biber | G01R 33/3692 324/309 |
| 2011/0169489 A1* | 7/2011 | Leussler | G01R 33/3692 374/E1.001 |
| 2012/0268131 A1* | 10/2012 | Assmann | A61B 5/0205 320/137 |
| 2013/0106419 A1* | 5/2013 | Biber | G01R 33/34 324/322 |
| 2013/0119981 A1* | 5/2013 | Choi | G01R 33/36 324/322 |
| 2013/0184566 A1* | 7/2013 | Kreischer | G01R 33/34084 324/309 |
| 2013/0311176 A1* | 11/2013 | Brown | H04R 1/1091 381/74 |
| 2013/0342350 A1 | 12/2013 | Popescu | |
| 2014/0009151 A1* | 1/2014 | Van Helvoort | G01R 33/34023 324/322 |
| 2014/0012127 A1 | 1/2014 | Biber et al. | |
| 2014/0088405 A1 | 3/2014 | Assmann et al. | |
| 2014/0275970 A1* | 9/2014 | Brown | G01R 33/3692 600/413 |
| 2014/0361769 A1* | 12/2014 | Hardie | G01R 33/3692 324/322 |
| 2015/0220763 A1* | 8/2015 | Porzelt | G08C 17/00 340/10.1 |
| 2015/0270736 A1* | 9/2015 | MacWilliams | H02J 50/90 320/101 |
| 2015/0320342 A1 | 11/2015 | Biber et al. | |
| 2016/0029135 A1* | 1/2016 | Benner | A61B 5/7465 381/57 |
| 2016/0064991 A1* | 3/2016 | Chung | H02J 50/10 320/108 |
| 2017/0119320 A1* | 5/2017 | Ueda | A61M 21/02 |
| 2017/0123034 A1 | 5/2017 | Chen et al. | |
| 2017/0281004 A1* | 10/2017 | Igney | G01R 33/307 |
| 2017/0311802 A1 | 11/2017 | Bollenbeck et al. | |
| 2018/0113181 A1 | 4/2018 | Popescu | |
| 2018/0128888 A1* | 5/2018 | Ropella | H04R 1/1083 |
| 2018/0247714 A1* | 8/2018 | Lee | A61B 5/055 |
| 2018/0314891 A1* | 11/2018 | Ota | G16H 40/63 |
| 2019/0044336 A1* | 2/2019 | Wagner | A61B 6/56 |

FOREIGN PATENT DOCUMENTS

| | | |
|---|---|---|
| CN | 107991634 A | 5/2018 |
| DE | 10151033 A1 | 5/2003 |
| DE | 102010028901 A1 | 11/2011 |
| DE | 102012211621 A1 | 1/2014 |
| DE | 102016207267 A1 | 11/2017 |

OTHER PUBLICATIONS

R. G. Lyons: "Digital Signal Processing: Frequency Translation without multiplication", DSP, EE Times-India, Sep. 2007, eetindia.com.

Wikipedia: "Transfer Jet"; Apr. 15, 2018, Wikipedia [online]. In: [https://de.wikipedia.org/windex.php?title=TransferJet&oldid=176545509 abgerufen am Jun. 17, 2019]; English-language translation included [https://en.wikipedia.org/wiki/TransferJet].

Cortech Solutions: "MR Safe fiber optic response pads", https://cortechsolutions.com/product/br-fr-foh8bd/, before Jul. 2, 2018.

IMROC-IR™: "Wireless Multi-Channel Communication System", Optoacoustics, www.optoacoustics.com/medical; before Jul. 2, 2018.

IMROC IR™: "Relax. You can talk again. And no cables.", Optoacoustics, www.optoacoustics.com/medical; before Jul. 2, 2018.

PSD: "Lumina MRI & MEG response pad system", Psychology Software Distribution, https://psychologysoftwaredistribution.com/itm/19/lumina-mri-ampmeg-response-pad-system, before Jul. 2, 2018.

German Action dated Jun. 19, 2019, for Application No. 10 2018 216 644.7.

* cited by examiner

FIG 4

MAGNETIC RESONANCE APPARATUS HAVING A PATIENT COMMUNICATION UNIT AND A METHOD FOR TRANSMITTING AT LEAST ONE COMMUNICATION SIGNAL

CROSS REFERENCE TO RELATED APPLICATIONS

This patent application claims priority to German Patent Application No. 102018216644.7, filed Sep. 27, 2018, which is incorporated herein by reference in its entirety.

BACKGROUND

Field

The present disclosure relates to a magnetic resonance apparatus having a scanner, a patient accommodating region, a patient support apparatus which can be moved within the patient accommodating region and a patient communication unit. Furthermore, the present disclosure relates to a method for transmitting at least one communication signal of a patient during a magnetic resonance examination.

Related Art

Patient communication systems in magnetic resonance apparatuses may include a patient call ball and/or a patient microphone. The patient call ball was in most cases previously operated pneumatically. However, for this purpose, a compressed air pipe must be placed within the magnetic resonance apparatus, in particular within a patient couch of the magnetic resonance apparatus, for transmitting communication signals. Pipes of this type must be taken into account during a movement of the patient couch, in order to prevent the pipe from being clamped and/or damaged. In addition, significant effort frequently has to be applied by the patient in order to actuate a pneumatic patient call ball.

With previous magnetic resonance systems, the patient microphone is frequently arranged at end regions of the patient accommodating region and thus at a large distance from the patient, in particular from the mouth of the patient. In the process, it may occur that when a patient's voice is detected, it is overlaid by loud ambient noises. For instance, here the voice is overlaid by the loud banging noises during the magnetic resonance examination. This nevertheless hampers communication between the patient and a medical operating personnel during the magnetic resonance examination.

Communication which is prone to error during the magnetic resonance examination can also have a negative effect on the patient, by him/her becoming anxious and thus carrying out unwanted movements, for instance. This, in turn, may lead to an image quality of the detected magnetic resonance image data being negatively affected and/or to the magnetic resonance examination measurements being aborted.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to provide a reliable and simple patient communication during a magnetic resonance examination on a patient.

The disclosure is based on a magnetic resonance apparatus having a scanner, a patient accommodating region, a patient support apparatus which can be moved within the patient accommodating region and a patient communication device. In accordance with the disclosure, the patient communication device includes at least one communication element which has a radio-frequency transmitter.

In an exemplary embodiment, the scanner of the magnetic resonance apparatus includes a magnet unit with a main magnet for generating a homogeneous and constant main magnetic field. Furthermore, the scanner includes a gradient coil unit and a radio-frequency antenna unit. The gradient coil unit is designed to generate magnetic field gradients during a magnetic resonance examination. Radio-frequency pulses are emitted for excitation by means of the radio-frequency antenna unit. Here the scanner can have a centrally arranged, tunnel-shaped and/or cylindrical opening, which includes the patient accommodating region, wherein in this regard the scanner surrounds the patient accommodating region in the manner of a cylinder. Moreover, the scanner can also surround the patient accommodating region in a C-shaped manner.

In an exemplary embodiment, the patient support apparatus has a movable patient couch, which is arranged movably within the patient accommodating region. During the magnetic resonance examination, the patient is positioned on the patient couch of the patient support apparatus. The patient couch can therefore be used to move the patient into an examination position within the patient accommodating region.

The patient communication device is provided for communication between the patient and a medical operating personnel, who is situated in a control center, during the magnetic resonance examination on the patient. The patient communication device can be used by the patient to notify the medical operating personnel of an emergency situation and/or stress situation. An emergency situation and/or stress situation of this type can be for instance if the patient is no longer able to lie still or if the patient needs to go to the toilet or the patient is suffering anxiety, etc.

To this end, the patient communication device has at least one communication element for communication between the patient and the medical operating personnel. The communication element can include a patient microphone or also a patient call ball, for instance.

The at least one communication element has in particular one radio-frequency transmitter. The radio-frequency transmitter is designed to emit a radio-frequency signal, which advantageously includes a communication signal. In particular, the radio-frequency transmitter includes an antenna for signal transmission purposes. In an exemplary embodiment, the signal transmission includes a transmission of detected communication signals of the patient to a radio-frequency receive unit, for instance a radio-frequency antenna, for forwarding to a signal output unit, which is arranged within a control center, such as, for instance, a loudspeaker, for outputting the communication signals to the medical operating personnel. In an exemplary embodiment, the antenna includes a magnetic loop, wherein the magnetic loop includes a maximum size of 10 mm by 10 mm. The antenna, in particular the magnetic loop, includes a maximum size of 9 mm by 9 mm. The antenna, in particular the magnetic loop, preferably includes a maximum size of 8 mm by 8 mm. The antenna, in particular the magnetic loop, preferably includes a maximum size of 7 mm by 7 mm. The antenna, in particular the magnetic loop, preferably includes a maximum size of 6 mm by 6 mm. The antenna, in particular the magnetic loop, preferably includes a maximum size of 5 mm by 5 mm.

If the at least one communication element includes a patient call ball, for instance, it may be advantageous if this one transmit frequency for transmitting the communication signal includes signals, which spectrally have a quarter of a scanning frequency after scanning and/or digitalization. In this regard, with a further processing of the signal, in particular of the communication signal, a simple, cyclical sign manipulation can be carried out in order to convert and/or evaluate the signal into a base band.

Moreover, it may also be that a corresponding signal, in particular communication signal, of a communication element embodied as a patient call ball is transmitted and/or detected by means of a receiving path provided for pilot tone navigation.

By means of this embodiment of the disclosure, in particular of the radio-frequency transmitter, flexible use of the at least one communication element can be achieved during the magnetic resonance examination on the patient. In particular, in this regard, no hardware connections, such as, for instance, a wired data connection and/or data lines and/or compressed air pipes etc. have to be taken into consideration between the at least one communication element and the scanner and/or the patient support apparatus during a movement of the patient couch. On account of the extremely small dimensions of the magnetic antenna, compared with the wavelength of the communication signal, electromagnetic waves do not develop during the transmission of the communication signals. For instance, the wavelength for the Larmor frequency is approx. 4.8 m with 1.5 T (corresponds to a Larmor frequency of approx. 63.8 MHz) for the magnetic resonance signals. In an exemplary embodiment, n antenna with the inventive dimensions is designed for signals, in particular communication signals, in the cm range. An antenna of this type is designed in the magnetic resonance frequency range in particular for a magnetic near field coupling for the purpose of transmitting signals, in particular the communication signals, so that the signal transmission advantageously includes no radio transmission.

Typically the at least one communication element moreover has a modulator, wherein the communication signal is preferably modulated before emission. For instance, the communication signal is modulated to form an analog signal, such as is useful in particular in an embodiment of the at least one communication element as a patient microphone. An amplitude modulation and/or an angle modulation can preferably be used here as possible modulation methods. Moreover, the modulation of the signal, in particular the modulation of the communication signal, can include a binary phase shift keying (BPSK) or an amplitude shift keying (ASK), such as is useful in particular when the at least one communication element is embodied as a patient call ball. The modulator of the communication element can be protected for instance against an overload, in particular an overload by in-coupling hydrogen magnetic resonance excitation signals (H-magnetic resonance signals), by the modulator being connected at a feed point to the antenna by means of diodes connected antiparallel for instance.

The present disclosure has the advantage that a contactless, in particular a wireless and/or pipeless transmission of communication signals from the patient accommodating region to a control center can be provided. In particular, a contactless, in particular a wireless and/or pipeless, transmission of communication signals can be carried out between the patient and a radio-frequency receive unit during the magnetic resonance examination. This also allows for a simple and reliable transmission of communication signals during the magnetic resonance examination. An advantageous reliability of the patient communication device can moreover have a calming effect on the patient.

In one advantageous development of the magnetic resonance apparatus, provision can be made for the at least one communication element to be embodied wirelessly with respect to the scanner and/or the patient support apparatus. In this regard, wireless should in particular be understood to mean that the at least one communication element is embodied cordlessly with respect to the scanner and/or patient support apparatus. In particular, transmission of communication signals is carried out wirelessly and cordlessly here. By this means, flexible use of the at least one communication element can be achieved during the magnetic resonance examination on the patient. In particular, in this regard, no hardware connections, such as, for instance, a compressed air pipe and/or a data connection etc. between the at least one communication element and the scanner and/or the patient support apparatus have to be taken into consideration during a movement of the patient couch.

In one advantageous development of the magnetic resonance apparatus, provision can be made for the magnetic resonance apparatus to have a radio-frequency antenna with an associated receive electronics for detecting magnetic resonance signals, wherein the receive electronics include at least one receive channel for detecting a communication signal of the patient communication device. This allows for a particularly simple, in particular a compact and component-saving design of the patient communication device, since here signal detection systems of the magnetic resonance apparatus which are already available can be used for the signal transmission of the communication signals.

In one advantageous development of the magnetic resonance apparatus, provision can be made for the at least one communication element to have an energy storage element with an energy recovery unit. In an exemplary embodiment, the energy storage element includes a rechargeable energy storage element, such as, in particular, an accumulator or a super capacitor, such as a GoldCap for instance. In an exemplary embodiment, the energy recovery unit is configured to generate an energy, in particular electrical energy, for the purpose of charging the energy storage element from a $B_0$ gradient field and/or a magnetic resonance excitation pulse. In particular, the energy storage element can be charged here by means of the energy recovery unit advantageously during the magnetic resonance examination. This is advantageous in that the at least one communication element is ready for use at any time for a detection of communication signals during the magnetic resonance examination.

Alternatively or in addition, the at least one communication element can also include a charging device, which includes a coupling to a power source, in particular a socket, for the purpose of charging the energy storage element.

In one advantageous development of the magnetic resonance apparatus, there may be provision for the at least one communication element to have an element for identifying the state of charge of the energy storage element. Here the element for identifying the state of charge can also be included in the energy storage element. In an exemplary embodiment, the element for identifying the state of charge includes a sensor element, which monitors the state of charge of the energy storage element. In this way, a current state of charge can be called up and/or monitored at any time. Moreover, a communication element can be used and/or selected for the magnetic resonance examination such that its state of charge corresponds to an operating time, wherein the operating time corresponds at least to the duration of the magnetic resonance examination. In such a way failure of the at least one communication element can be prevented during the magnetic resonance examination. For instance, here the state of charge, such as for instance "sufficient charge" or "charge needed" etc., of the energy storage element can be transmitted by a phase shift keying, in particular an encoded phase shift keying, such as in particular BPSK, of the transmit signal to the magnetic resonance apparatus, in particular to a user interface of the magnetic resonance apparatus, so that the user can moreover be informed at any time of a current state of charge.

In one advantageous development of the magnetic resonance apparatus, provision can be made for the at least one communication element to have a magnetic field sensor. In an exemplary embodiment, the magnetic field sensor is formed by a Hall effect sensor. An embodiment of the magnetic field sensor which deviates therefrom is however also essentially conceivable at any time. The at least one magnetic field sensor, in particular Hall effect sensor, can be used advantageously to carry out a simple localization of the at least one communication element within the magnetic field of the magnetic resonance apparatus. In particular, the at least one communication element can be activated in this way, wherein the activation is dependent on a $B_0$ field identification of the magnetic field by the magnetic field sensor, in particular Hall effect sensor. Moreover, there can be provision, at the start of the activation, for a test signal to be emitted from the at least one communication element, as a result of which a functional test can advantageously be carried out for the at least one communication element, in particular before the start of the magnetic resonance examination. After emitting the test signal, provision can further be made for a functional mode for activating the communication element to be deactivated in order to save energy for the transmission of the communication signals.

In one advantageous development of the magnetic resonance apparatus, provision can be made for the at least one communication element to include a patient call ball. In an exemplary embodiment, the patient call ball includes a ball-type element with at least one key, for instance an emergency call key. The emergency call key is preassigned in particular a specific or defined situation, in particular an emergency situation. When the patient presses the emergency call key, the magnetic resonance examination preferably stops immediately. After activation at the start of the magnetic resonance examination, the emergency call key is preferably active during the entire duration of the magnetic resonance examination, so that this function is available to the patient during the entire duration of the magnetic resonance examination. Moreover, the patient call ball can also have more than one key, wherein the further keys can likewise be preassigned for specific or defined situations, such as, for instance, a function key for the functional magnetic resonance imaging (fMRI). This embodiment of the disclosure allows for a simple and safe use of a patient call ball during the magnetic resonance examination.

In one advantageous development of the magnetic resonance apparatus, provision can be made for the at least one communication element to include a patient microphone. The patient microphone is to be used to detect speech signals and/or speech information from the patient during the magnetic resonance examination, wherein these speech signals can be directed to the medical operating personnel. For instance, the patient microphone of the patient can be used to communicate his/her condition to the medical operating personnel during the magnetic resonance examination or also to red-flag an unpleasant situation during the magnetic resonance examination. On account of the inventive embodiment, in particular on account of the cordless and/or wireless embodiment, the patient microphone can advantageously be arranged in spatial proximity to the patient. Through this an advantageous detection and transmission of communication signals, in particular of speech signals of the patient, can also take place. On account of the spatial proximity of the patient microphone to the patient, loud and/or disruptive ambient noises can also be reduced during the detection of the speech signals and/or speech information and an advantageous SNR (signal-to-noise ratio) can therefore also be achieved for a further processing of the detected signals.

In one advantageous development of the magnetic resonance apparatus, provision can be made for the patient communication device to include a controller, which is designed to deactivate the at least one communication element during a receive phase for receiving magnetic resonance signals during a magnetic resonance examination. In an exemplary embodiment, the controller includes a hardware for controlling the time flows, in particular the deactivation of the at least one communication element during a receive phase for receiving magnetic resonance signals during a magnetic resonance examination. Alternatively or in addition, the controller can also include a software and/or computer programs, wherein when the software and/or computer programs is/are run in a processor of the controller, the at least one communication element is controlled accordingly. Here the software and/or computer programs can be stored in a storage unit of the controller.

By means of this embodiment of the disclosure, a transmission of a communication signal during a receive phase of magnetic resonance signals and thus an unwanted interference of the receive phase of magnetic resonance signals can be prevented, for instance. This is useful in particular if the at least one communication element is embodied as a patient microphone. In particular, here the patient microphone can be activated or also deactivated as a function of a transmit signal, in particular an excitation pulse, of the radio-frequency antenna. For instance, a deactivation phase can be fixed to a defined and/or specific period of time after a radio-frequency pulse has been emitted, wherein the deactivation phase preferably includes the receive phase. The deactivation phase preferably includes 1 s. The deactivation phase particularly advantageously includes 2 s. The deactivation phase particularly advantageously includes 3 s. For instance, the patient microphone can be deactivated for a defined period of time, e.g. 2 s, after the transmit signal has been emitted, since, in this period of time, magnetic resonance signals, for instance echo signals, can be detected. It is thus possible to prevent the patient microphone from disturbing the magnetic resonance imaging.

Alternatively to this, provision can also be made for an emission of the communication signal to be controlled by way of a light signal, for instance a modulation of an illumination of the patient accommodating region and/or an IR signal.

The controller can be included here in the at least one communication element of the patient communication device. Here the controller can include a sensor, for instance the magnetic field sensor, which is sensitive to the emitted signal of the radio-frequency antenna, in particular the radio-frequency transmit antenna of the magnetic resonance apparatus, coupled to a time controller. Moreover, other embodiments of the controller that appear to the person skilled in the art as beneficial are also possible at any time.

In one advantageous development of the magnetic resonance apparatus, provision can be made for the at least one communication element to have a fastening element. This allows for a simple and rapid arrangement of the at least one communication element in proximity to the patient during the magnetic resonance examination. For instance, the fastening element can include a suction cup for in particular an arrangement of the at least one communication element on an enclosure of the magnetic resonance apparatus which surrounds the patient accommodating region. Alternatively or in addition, the fastening element can include a clip for in particular an arrangement of the at least one communication element on the patient, in particular clothes of the patient. Alternatively or in addition, the fastening element can also have a Velcro fastener and/or further fastening elements which appear(s) to be useful to the person skilled in the art. This embodiment of the disclosure allows the communication element to be arranged close to the patient, particularly in an embodiment of the at least one communication element as a patient microphone. Moreover, an advantageous detection, in particular a trouble-free detection, of the communication signals of the patient can also be achieved.

Furthermore, the disclosure is based on a method for transmitting at least one communication signal of a patient during a magnetic resonance examination, wherein the method is carried out by means of a magnetic resonance apparatus, wherein the magnetic resonance apparatus includes a scanner, a patient accommodating region, a patient support apparatus which can be moved within the patient accommodating region and a patient communication device, wherein the patient communication device includes at least one communication element which has a radio-frequency transmitter. In an exemplary embodiment, the method includes:

Detecting the at least one communication signal of the patient by means of a communication element of the magnetic resonance apparatus, Processing the at least one communication signal within the communication element, and Transmitting the communication signal by means of a radio-frequency transmitter of the communication element, wherein the transmission of the communication signal is carried out cordlessly.

The detection of the at least one communication signal can be carried out by the patient pressing a key, such as for instance when the communication element is embodied as a patient call ball. Alternatively or in addition, the at least one communication signal can be detected by means of detecting a speech signal of the patient, such as, for instance, with an embodiment of the communication element as a patient microphone.

In an exemplary embodiment, the transmission and/or emission of the communication signal is performed by the radio-frequency transmitter, wherein the radio-frequency transmitter includes an antenna with a magnetic loop. In an exemplary embodiment, the antenna includes a size in the mm range.

The disclosure allows for flexible use of the at least one communication element during the magnetic resonance examination on the patient. In particular, in this regard, no hardware connections, such as, for instance, a wired data connection and/or data lines and/or pressure pipes etc. have to be taken into consideration for a data transmission between the at least one communication element and the scanner and/or the patient support apparatus during a movement of the patient couch. On account of the extremely small dimensions of the magnetic antenna, compared with the wavelength of the communication signal, electromagnetic waves do not develop during the transmission of the communication signals. In particular, the radio-frequency transmitter, in particular the antenna, is designed for a magnetic near field coupling for the transmission of the signals, in particular of the communication signals, so that the signal transmission is advantageously not included in a radio transmission. The present disclosure also has the advantage that a contactless, in particular a wireless and/or pipeless, transmission of communication signals from the patient accommodating region to a control center can be provided. This also allows for a simple and reliable transmission of communication signals during the magnetic resonance examination, which can also contribute to reassuring the patient during the magnetic resonance examination.

The advantages of the inventive method for transmitting at least one communication signal of a patient during a magnetic resonance examination essentially correspond to the advantages of the inventive magnetic resonance apparatus, which are set out previously in detail. Features, advantages or alternative embodiments mentioned here can likewise also be transferred to the other claimed subject matters and vice versa.

In one advantageous development of the method according to the disclosure, provision can be made for the processing of the at least one communication signal to include a signal modulation. For instance, the communication signal, in particular a communication signal of a patient microphone, can be modulated into an analog signal. Here an amplitude modulation and/or an angle modulation can preferably be used as possible modulation methods. Moreover, the modulation of the signal, in particular the modulation of the communication signal, can include a binary phase shift keying (BPSK) or an amplitude shift keying (ASK), such as is useful in particular when the at least one communication element is embodied as a patient call ball. This embodiment of the disclosure allows for a simple emission of communication signals in the radio-frequency range.

In one advantageous development of the inventive method, provision can be made for the communication element to be activated upon introduction into a magnetic field of the magnetic resonance apparatus. To this end, the communication element preferably has a magnetic field sensor, such as in particular a Hall effect sensor. For instance, in this regard the communication element can be activated as a function of a $B_0$ field identification of the magnetic field by the magnetic field sensor. In this regard an energy-saving operating mode of the communication element can advantageously be provided, by the communication element being deactivated outside of the magnetic field and thus outside of the patient accommodating region.

In one advantageous development of the inventive method, provision can be made for a test signal to be emitted after the activation of the at least one communication signal. In this regard, a function test of the communication element can advantageously be reached. The function test of the communication element and thus the emission of the test signal is preferably carried out in terms of time before the magnetic resonance examination, so that a ready-for-use communication element is always available to the patient during the magnetic resonance examination for communication purposes. After emitting the test signal, provision can further be made for a functional mode for activating the communication element to be deactivated in order to save energy for the transmission of the communication signals.

In one advantageous development of the inventive method, provision can be made for a communication signal to be emitted continuously during a defined and/or specific period of time. The defined and/or specific period of time preferably includes a few seconds, such as, for instance 2 s. Moreover, the defined and/or specific period of time can also include 1 s. Moreover, the defined and/or specific period of time can also include 3 s. Moreover, the defined and/or specific period of time can also include 4 s. Moreover, the defined and/or specific period of time can also include 5 s. The defined and/or specific period of time is preferably greater than a period of time for an emission of a magnetic resonance signal following a magnetic resonance excitation. This can ensure that the emitted communication signal is not entirely covered by magnetic resonance signals within this defined and/or specific period of time and a time instant for transmitting the communication signal is always present. This can be used particularly advantageously when the communication element is embodied as a patient call ball, since here in most cases only a brief pressing of a key is detected as communication signals. If this key pressing of the patient call ball key coincides in terms of time with the detection of magnetic resonance signals, the communication signal of the patient call ball can still be transmitted in this way.

In one advantageous development of the inventive method, provision can be made for an emission of the communication signal by the communication element to be controlled as a function of a receive phase for receiving magnetic resonance signals during a magnetic resonance examination. To this end, the patient communication device preferably has a controller with a corresponding hardware for controlling the time flows, in particular the deactivation of the at least one communication element during a receive phase for receiving magnetic resonance signals during a magnetic resonance examination. Alternatively or in addition, the controller can also include a software and/or computer programs, wherein the software and/or computer programs is/are designed to deactivate the at least one communication element during a receive phase for the purpose of receiving magnetic resonance signals during a magnetic resonance examination. In such a way, transmission of a communication signal during a receive phase of magnetic resonance signals and thus an unwanted interference of the receive phase of magnetic resonance signals can be prevented. In particular, here the patient microphone can be activated or also deactivated as a function of a magnetic resonance transmit signal of the radio-frequency antenna. For instance, a deactivation phase can be fixed to a defined and/or specific period of time after a radio-frequency pulse and/or excitation pulse has been emitted, wherein the deactivation phase preferably includes the receive phase. The deactivation phase preferably includes 1 s. The deactivation phase particularly advantageously includes 2 s. The deactivation phase particularly advantageously includes 3 s. For instance, the patient microphone can be deactivated for a defined period of time, e.g. 2 s, after the transmit signal has been emitted, since, in this period of time, magnetic resonance signals, for instance echo signals, can be detected. It is thus possible to prevent the patient microphone from disturbing the magnetic resonance imaging.

Alternatively or in addition, an emission of the communication signal by the communication element can be controlled as a function of a magnetic resonance excitation transmit pulse during the magnetic resonance examination. The communication element can likewise be controlled here by the controller.

In one advantageous development of the inventive method, provision can be made for the transmitted communication signal to be received by means of a receive channel of the magnetic resonance apparatus. This allows for a particularly simple, in particular a compact and component-saving design of the patient communication device to be achieved, since here signal detection systems of the magnetic resonance apparatus which are already available can be used for the signal transmission of the communication signals. The received communication signal is preferably transmitted from the radio-frequency antenna to further units for further processing and/or outputting of the communication signal.

Furthermore, provision can also be made for the receive signal also to be combined from a number of individual signals, as a result of which an advantageous increase in a signal-to-noise ratio of the detected signals can be achieved. Moreover, it is also conceivable for a number of receive paths to be available for the signal transmission of the communication signal.

In one advantageous development of the inventive method, provision can be made for the communication element to include an energy storage element, wherein the energy storage element can be charged cordlessly during the magnetic resonance examination. In this regard, the energy storage element preferably includes a rechargeable energy storage element, such as an accumulator or a super capacitor, for instance. Energy, in particular electrical energy, is preferably generated from a $B_0$ gradient field and/or a magnetic resonance excitation pulse during the magnetic resonance examination in order to recharge the energy storage element. This is advantageous in that the at least one communication element is ready for use at any time for a detection of communication signals during the magnetic resonance examination. Moreover, the energy storage element can be recharged with energy during the entire duration of the magnetic resonance examination.

Figure 1:
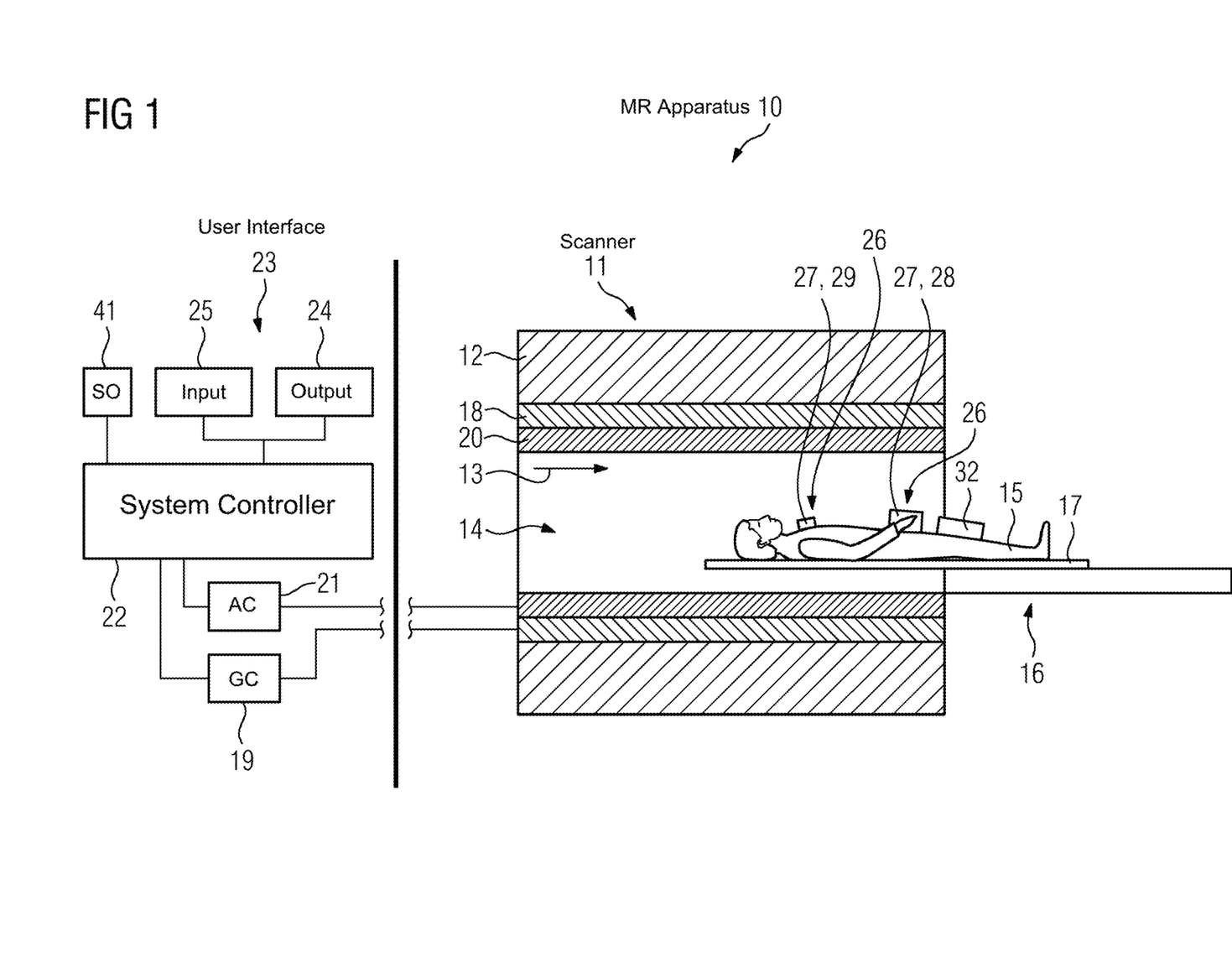
FIG. 1 shows an inventive magnetic resonance apparatus according to an exemplary embodiment.

FIG. 1 shows a schematic diagram of an inventive magnetic resonance apparatus 10 according to an exemplary embodiment. In an exemplary embodiment, the magnetic resonance apparatus 10 includes a scanner 11, which is formed by a magnet unit. The scanner 11 includes a superconducting main magnet 12 for generating a powerful and in particular constant main magnetic field 13. In addition, the magnetic resonance apparatus 10 has a patient accommodating region 14 to accommodate a patient 15. In the present exemplary embodiment, the patient accommodating region 14 is configured cylindrical and in a peripheral direction is surrounded cylindrically by the scanner 11. In principle, however, it is always conceivable that the patient accommodating region 14 has a different design. The patient 15 can be pushed and/or slid by means of a patient support apparatus 16 of the magnetic resonance apparatus 10 into the patient accommodating region 14. The patient support apparatus 16 to this end has a patient couch 17 embodied movably within the patient accommodating region 14.

The scanner 11, in particular the magnet unit, also has a gradient coil unit 18 for generating magnetic field gradients that are used for position encoding during an imaging process. The gradient coil unit 18 is controlled by means of a gradient controller 19 of the magnetic resonance apparatus 10. The scanner 11, in particular the magnet unit, further includes a radio-frequency antenna unit 20 for exciting a polarization, which is produced in the main magnetic field 13 generated by the main magnet 12. The radio-frequency antenna unit 20 is controlled by a radio-frequency antenna controller 21 of the magnetic resonance apparatus 10 and radiates radio-frequency magnetic resonance sequences into the patient accommodating region 14.

The magnetic resonance apparatus 10 has a system controller 22 for controlling the main magnet 12, the gradient controller 19 and the radio-frequency antenna controller 21. The system controller 22 centrally controls the magnetic resonance apparatus 10, for instance implementing a predetermined imaging gradient echo sequence. Furthermore, the system controller 22 includes an evaluator (not shown in detail) configured to evaluate medical image data which is acquired during the magnetic resonance examination. In an exemplary embodiment, the controller 22 includes processor circuitry that is configured to perform one or more functions and/or operations of the controller 22.

In addition, the magnetic resonance apparatus 10 includes a user interface 23, which is connected to the system controller 22. Control information such as, for example, imaging parameters and reconstructed magnetic resonance images can be displayed on an output unit 24, for example on at least one monitor and/or a display of the user interface 23 for medical operating personnel. In addition, the user interface 23 has an input unit 25, which can be used by the medical operating personnel to enter data and/or parameters during a measurement process.

The magnetic resonance apparatus 10 has a patient communication device 26 to allow the patient to communicate with the medical operating personnel during the magnetic resonance examination. In an exemplary embodiment, the communication device 26 (including one or more of the components of the communication device 26 includes processor circuitry that is configured to perform one or more functions and/or operations of the communication device 26. The patient communication device 26 includes at least one communication element 27. In the present exemplary embodiment, the patient communication device 26 has two communication elements 27. The present disclosure is however not restricted to an embodiment of the patient communication device 26 with two communication elements 27. The patient communication device 26 can also only include one single communication element 27 or also more than two communication elements 27.

In the present exemplary embodiment, a first of the two communication elements 27 is formed by a patient call ball 28. The communication element 27 embodied as a patient call ball 28 is shown schematically in more detail in FIG. 2. In the present exemplary embodiment, a second of the two communication elements 27 is formed by a patient microphone 29. The communication element 27 embodied as a patient microphone 29 is shown schematically in more detail in FIG. 2.

The two communication elements 27 are described in more detail below. Components, features and functions of the different communication elements 27 remaining essentially the same are identified below with the same reference signs.

Figure 2:
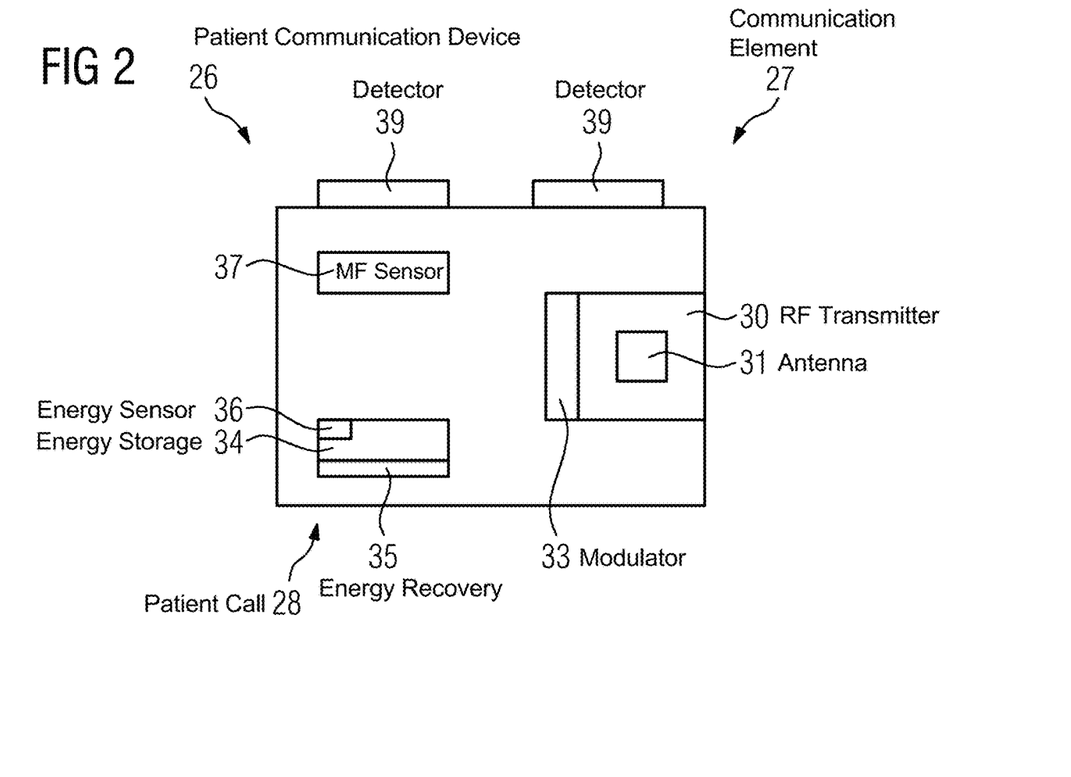
FIG. 2 illustrates a communication element, according to an exemplary embodiment, of a patient communication device of the magnetic resonance apparatus.
Figure 3:
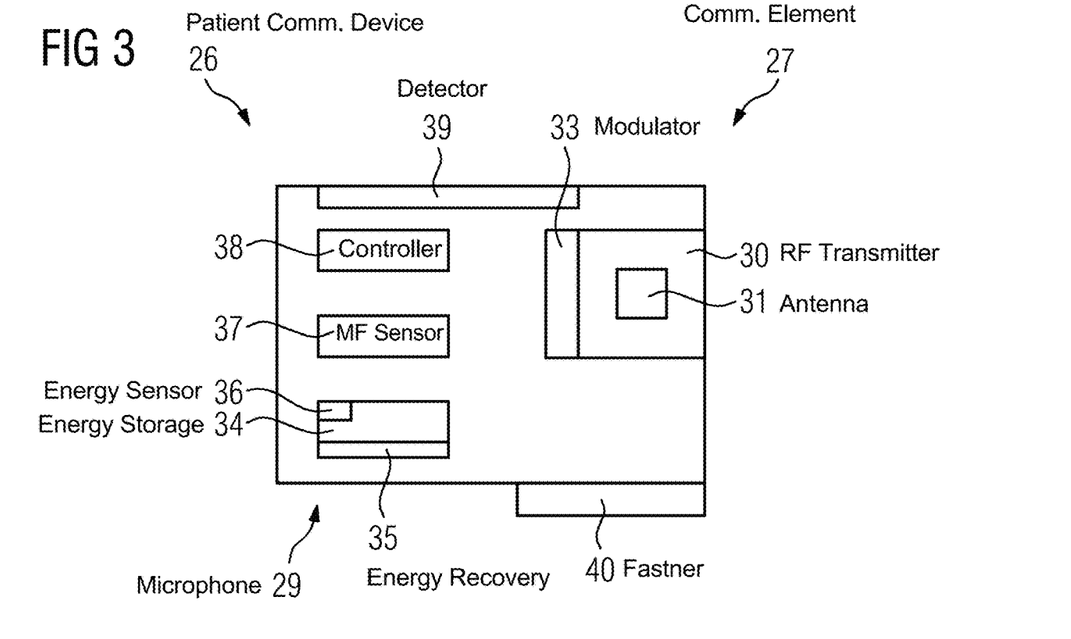
FIG. 3 illustrates a communication element, according to an exemplary embodiment, of the patient communication device of the magnetic resonance apparatus.

The two communication elements 27 each have a radio-frequency transmitter 30 (FIG. 2 and FIG. 3). On account of the radio-frequency transmitter 30, the individual communication elements 27 are embodied wirelessly or also cordlessly relative to the scanner 11 and/or the patient support apparatus 16. The radio-frequency transmitter 30 of the individual communication elements 27 is designed to emit a radio-frequency signal. The radio-frequency signal here includes the communication signal or the communication signals.

The individual communication elements 27, in particular the individual radio-frequency transmitters 30, each include an antenna 31 for signal transmission (FIG. 2 and FIG. 3). The individual antennae 31 preferably include a magnetic loop in each case, wherein the magnetic loop includes a maximum size of 10 mm by 10 mm. The individual antennae 31, in particular the magnetic loops, preferably include a maximum size of 9 mm by 9 mm. The individual antennae 31, in particular the magnetic loops, preferably include a maximum size of 8 mm by 8 mm. The individual antennae 31, in particular the magnetic loops, preferably include a maximum size of 7 mm by 7 mm. The individual antennae 31, in particular the magnetic loops, preferably include a maximum size of 6 mm by 6 mm. The individual antennae 31, in particular the magnetic loops, preferably include a maximum size of 5 mm by 5 mm. The individual antennae 31 with the inventive dimensions are preferably designed for emitting radio-frequency signals in the cm range. An antenna 31 of this type for the magnetic resonance frequency is designed in particular for a magnetic near field coupling for the purpose of transmitting signals, in particular the communication signals, so that the signal transmission advantageously includes no radio transmission.

The magnetic resonance apparatus 10 has a radio-frequency antenna 32 for receiving the communication signals, the radio-frequency antenna being designed to detect magnetic resonance signals during a magnetic resonance examination (32). The radio-frequency antenna 32 here includes a number of antenna elements and associated receive channels for receiving radio-frequency signals, in particular magnetic resonance signals, wherein at least one receive channel of the radio frequency antenna is embodied to detect a radio frequency signal of the patient communication device 26 comprising the communication signal or the communication signals.

The individual communication elements 27 moreover in each case include a modulator 33 (FIG. 2 and FIG. 3). In the present exemplary embodiment, the modulator 33 is embodied separately from the radio-frequency transmitter 30 of the respective communication element 27. Moreover, there can also be provision for the modulator 33 to include the radio-frequency transmitter 31 of the respective communication element 27. The modulator 33 is provided and/or designed to modulate the communication signal before emitting and/or transmitting the communication signal. A modulator 33 of this type can be protected for instance against an overload, in particular an overload by in-coupling hydrogen magnetic resonance signals (H-magnetic resonance signals), by the modulator 33 being connected at a feed point to the antenna 31 of the radio-frequency transmitter 30 by means of diodes connected antiparallel for instance.

In the case of an embodiment of the communication element 27 as a patient call ball 28, the modulator 33 is designed to modulate the communication signal, which includes a binary phase shift keying (BPSK) or an amplitude shift keying (ASK). In the case of an embodiment of the communication element 27 as a patient microphone 29, the modulator 33 is designed to modulate the communication signal, which includes an amplitude modulation and/or an angle modulation. In an exemplary embodiment, the communication signal is modulated into an analog communication signal.

Moreover, the individual communication elements 28 each include an energy storage element 34 (FIG. 2 and FIG. 3). In an exemplary embodiment, the individual energy storage elements 34 are configured to store electrical energy and, in an exemplary embodiment, include an accumulator and/or a supercapacitor in each case. Moreover, in a further embodiment of the disclosure, the individual energy storage elements 34 can also include further energy storage elements 34 which appear useful to the person skilled in the art. The individual communication elements 27 moreover in each case include an energy recovery unit 35 (FIG. 2 and FIG. 3). In an exemplary embodiment, the energy recovery units 35 are configured to generate electrical energy for charging the energy storage element 34 from a $B_0$ gradient field and/or a magnetic resonance excitation pulse. For instance, the energy storage element 34 can be recharged by means of the energy recovery unit 35 advantageously during the magnetic resonance examination. In an exemplary embodiment, the energy recover unit 35 is an electrical charger.

Alternatively or in addition, the individual communication elements 27 can also include a charging device, which includes a coupling to a power source, in particular a socket, for the purpose of charging the respective energy storage element 34.

Furthermore, the individual communication elements 27 each include an element 36 for identifying the state of charge of the energy storage element 34 (FIG. 2 and FIG. 3). Here the element 36 for identifying the state of charge can also be included in the energy storage element 34. In an exemplary embodiment, the element 36 for identifying the state of charge includes a sensor, which monitors the state of charge of the energy storage element 34. Here a state of charge signal, which corresponds to a state of charge of the energy storage element 34, can be detected by the element 36 for identifying the state of charge. Moreover, the state of charge signal or also a state of charge, such as for instance "sufficient charge" or "charge required" etc., of the energy storage element 34 can be transmitted by a phase shift keying, in particular an encoded phase shift keying, such as in particular BPSK, of the transmit signal to the magnetic resonance apparatus 10, in particular to the user interface 23 of the magnetic resonance apparatus 10, and are output there for a user, in particular medical operating personnel.

Moreover, the individual communication elements 27 each include a magnetic field sensor 37 (FIG. 2 and FIG. 3). In the present exemplary embodiment, the magnetic field sensor 37 is formed in each case by a Hall effect sensor. A $B_0$ field identification can take place using the magnetic field sensor 37, in particular the Hall effect sensor. It can thus be detected whether the magnetic field sensor 37 and thus also the respective communication element 27 is/are arranged within the patient accommodating region 14 and thus within the magnetic field, in particular the main magnetic field 13, of the magnetic resonance apparatus 10. As soon as the magnetic field sensor 37 and thus also the respective communication element 27 is arranged within the patient accommodating region 14, the at least one communication element 27 can be activated.

Moreover, the patient communication device 26 includes a controller 38, which is designed to deactivate the communication element 27 embodied as a patient microphone 29 during a receive phase for receiving magnetic resonance signals during a magnetic resonance examination. In an exemplary embodiment, the controller 38 includes a requisite hardware (e.g. processor) for controlling the time flows, in particular the deactivation of the at least one communication element during a receive phase for receiving magnetic resonance signals during a magnetic resonance examination. In an exemplary embodiment, alternatively or in addition, the controller can include a software and/or computer programs, wherein when the software and/or computer programs are run in a processor of the controller 38, the communication element 27 is controlled correspondingly. The software and/or computer programs can be stored here in a storage unit of the controller 38 and/or in an external memory accessible by the controller 38. Alternatively or in addition, emission of the communication signal by the communication element can be controlled as a function of a magnetic resonance excitation transmit pulse during the magnetic resonance examination. The communication element can likewise be controlled here by the controller.

The patient call ball 28 conversely is activated for the entire duration of the magnetic resonance examination so that the patient 15 can make an emergency call at any time.

The individual communication elements 27 moreover in each case include a detection unit 39 for detecting the communication signal or the communication signals (FIG. 2 and FIG. 3). The detection unit 39 of the communication element 27 embodied as a patient call ball 28 here has at least one key. In the present exemplary embodiment, the patient call ball 28 has at least two keys (FIG. 2), wherein in an alternative embodiment of the disclosure, the patient call ball 28 can also have just one key or also more than two keys. The detection unit 39 of the communication element 27 embodied as a patient microphone 29 has an acoustic detection unit 39 for detecting acoustic speech signals and sounds from the patient 15 (FIG. 3).

The communication element 27 of the patient communication device 26 embodied as a patient microphone 29 moreover has a fastening element 40. In the present exemplary embodiment, the fastening element 40 includes a clip for in particular an arrangement of the communication element 27, in particular of the patient microphone 29, on the patient 15, in particular clothes of the patient 15. In an alternative embodiment of the communication element 27, in particular of the fastening element 40, the fastening element 40 can also include a suction cup for in particular an arrangement of the communication element 27, in particular of the patient microphone 29, on an enclosure surrounding the patient accommodating region 14. Alternatively or in addition, the fastening element 40 can also have a Velcro fastener and/or further fastening elements 40 which appear to be useful to the person skilled in the art.

The magnetic resonance apparatus 10 shown can naturally include further components which magnetic resonance apparatuses usually have. A general operating principle of a magnetic resonance apparatus 10 is moreover known to the person skilled in the art, so that a detailed description of the further components is dispensed with.

Figure 4:
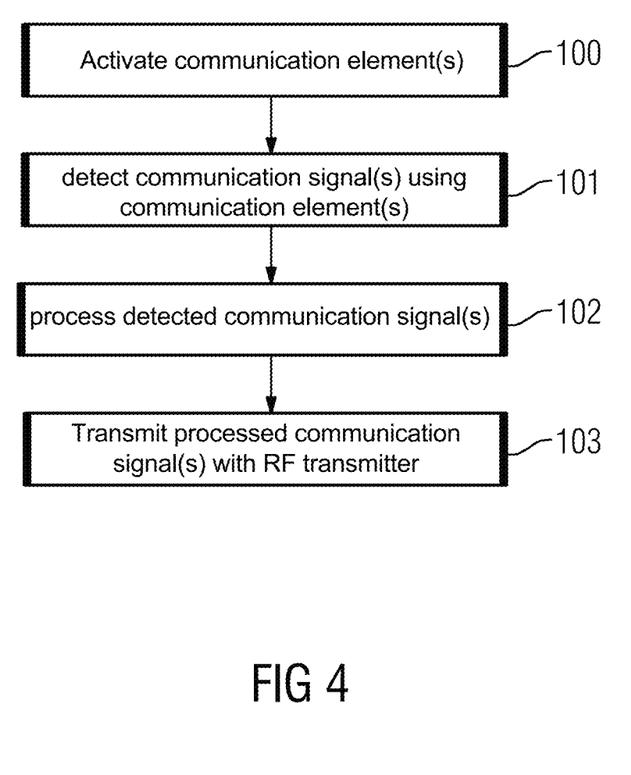
FIG. 4 illustrates a method for transmitting at least one communication signal of a patient during a magnetic resonance examination according to an exemplary embodiment.

FIG. 4 shows an inventive method for transmitting at least one communication signal of a patient 15 during a magnetic resonance examination according to an exemplary embodiment. The inventive method is carried out by means of the afore-described magnetic resonance apparatus 10, in particular the patient communication device 26.

In an exemplary embodiment, in order to carry out the inventive method, at least one communication element 27, in the present exemplary embodiment both communication elements 27, is firstly activated in a first method step 100. By means of activation, the two communication elements 27 are switched into a ready mode, wherein in this ready mode the individual communication elements 27 are ready and/or active at any time for a detection of a communication signal or also a number of communication signals. In an exemplary embodiment, the activation of the communication elements 27 is carried out here as a function of the $B_0$ field identification of the magnetic field by means of the magnetic field sensor 37, in particular the Hall effect sensor, of the respective communication element 27. A deactivation of the individual communication elements 27 can take place for instance if the respective communication element 27 is removed from the magnetic field of the magnetic resonance apparatus 10, such as, in particular, when the patient 15 exits the patient accommodating region 14 after the magnetic resonance examination has ended. In this way activation of the individual communication elements 27 is carried out automatically.

In this first method step 100, after activating the communication element 27 or also the communication elements 27, a test signal is emitted in order to carry out a functional test of the communication element 27 or also of the communication elements 27 before starting the magnetic resonance examination. The test signal can be transmitted continuously for a predetermined or defined period of time, for instance. In particular, the test signal can be transmitted for a predetermined or defined period of time of 2 s. Alternatively, the test signal can also be transmitted for a predetermined or defined period of time of just 1 s or also of 3 s or more. The test signal is emitted by means of the radio-frequency transmitter 30 of the respective communication element 27. After emitting the test signal, provision can also be made for one functional mode for activating the test signal to be deactivated for a predetermined and/or specific period of time in order to save energy for the transmission of the communication signals. The predetermined and/or specific period of time can include 1 min for instance. The predetermined and/or specific period of time can include 2 min for instance. The predetermined and/or specific period of time can include 3 min for instance. The predetermined and/or specific period of time can include 4 min for instance. The predetermined and/or specific period of time can include 5 min for instance.

The first method step 100 can also only be optional. For instance, in an alternative embodiment of the disclosure, the communication element 27 can be manually activated by the medical operating personnel before the start of the magnetic resonance examination.

In a second method step 101, the at least one communication signal of the patient 15 is detected by means of one of the communication elements 27 of the magnetic resonance apparatus 10. The detection can be carried out here by pressing the key of the communication element 27 embodied as a patient call ball 28. In addition, the detection can include detecting a speech signal of the patient 15 by means of the communication element 27 embodied as a patient microphone 29.

In a subsequent third method step 102, the at least one detected communication signal is processed within the respective communication element 27. In this third method step 102, a signal modulation of the detected communication signal or of the detected communication signals takes place by means of the respective modulator 33 for instance. For instance, when one of the communication elements 27 is embodied as a patient call ball 28, the signal modulation can include a simple phase shift keying such as, for instance, a bipolar phase shift keying BPSK or an amplitude shift keying ASK. When one of the communication elements 27 is embodied as a patient microphone 28, the communication signal or also the communication signals is/are converted into an analog signal or analog signals. In this regard an amplitude modulation or also a frequency modulation of the corresponding communication signals are suitable in particular.

In a further, fourth method step 103, the communication signal or the communication signals is/are transmitted by means of the radio-frequency transmitter 30 of the respective communication element 27, wherein the transmission of the communication signal is carried out cordlessly. The transmission and/or emission of the communication signal, in particular of a communication signal of the communication element 27 formed by the patient call ball 28, can take place continuously here during a defined and/or specific period of time. In an exemplary embodiment, the defined and/or specific period of time is greater than a period of time for an emission of a magnetic resonance signal following a magnetic resonance excitation. The defined and/or specific period of time includes a few seconds, such as, for instance 2 s. Moreover, the defined and/or specific period of time can also include 1 s. Moreover, the defined and/or specific period of time can also include 3 s. Moreover, the defined and/or specific period of time can also include 4 s. Moreover, the defined and/or specific period of time can also include 5 s. This is particularly useful with an embodiment of one of the communication elements 27 as a patient call ball 28, since otherwise the communication signal, which is generated by pressing a key, can be covered by a magnetic resonance signals.

The transmission and/or emission of the communication signals by the communication element 27, in particular of the communication element 27 formed by the patient microphone 29, can moreover be controlled as a function of a receive phase for receiving magnetic resonance signals during the magnetic resonance examination. In an exemplary embodiment, control of the emission and/or transmission of the communication signals is performed by controller 38. In particular, here the patient microphone 29 can be activated or also deactivated as a function of a transmit signal of the radio-frequency antenna 32 of the magnetic resonance apparatus 10. For instance, the deactivation phase can be fixed to a defined and/or specific period of time after emitting a radio-frequency pulse and/or excitation pulse, wherein the deactivation phase includes the receive phase. The deactivation phase includes 1 s. The deactivation phase particularly advantageously includes 2 s. The deactivation phase particularly advantageously includes 3 s. For instance, the patient microphone 29 can be deactivated for a defined period of time, e.g. 2 s, after the transmit signal has been emitted, since, in this period of time, magnetic resonance signals, for instance echo signals, can be detected. It is thus possible to prevent the patient microphone from disturbing the magnetic resonance imaging.

The transmitted communication signals are received in this fourth method step 103 by means of the receive channel of the radio-frequency antenna 32 of the magnetic resonance apparatus 10 and forwarded from there to a signal processing unit (not shown in more detail) or a signal output unit 41, such as for instance a loudspeaker or also the user interface 23 within a control center.

In order to supply energy to the communication elements 27, the energy storage elements 34 of the communication elements 27 can be charged cordlessly during the magnetic resonance examination by means of the energy recovery unit 35. The energy storage element 34 can be charged here during the first method step 100 and/or the second method step 101 and/or the third method step 102 and/or the fourth method step 103.

Although the disclosure has been illustrated and described in detail with the preferred exemplary embodiment, the disclosure is not restricted by the examples disclosed and other variations can be derived therefrom by a person skilled in the art without departing from the protective scope of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A magnetic resonance apparatus, comprising: a scanner including a patient accommodating region and a region-frequency antenna unit configures to radiate radio-frequency magnetic resonance sequence into the patient accommodating region to determine magnetic resonance image data; a patient support apparatus configured to support a patient and be moved within the patient accommodating region; and a patient communication device proximal to the patient and that includes: at least one communication element having radio-frequency transmitter, and a controller configured to: generate a notification signal based on an input from the patient located within the patient accommodating region; and control the at least one communication element to transmit the notification signal from within the patient accommodating region using the radio-frequency transmitter of the at least one communication element.

2. The magnetic resonance apparatus as claimed in claim 1, wherein the at least one communication element is wirelessly coupled the scanner and/or the patient support apparatus.

3. The magnetic resonance apparatus as claimed in claim 1, wherein the magnetic resonance apparatus further comprises a radio-frequency antenna with associated receive electronics configured to detect magnetic resonance signals, the receiver electronics including at least one receive channel configured to detect the notification signal of the patient communication device.

4. The magnetic resonance apparatus as claimed in claim 1, wherein the patient communication device further comprises an energy storage device with an energy charger.

5. The magnetic resonance apparatus as claimed in claim 4, wherein the patient communication device further comprises a sensor configured to identify a state of charge of the energy storage device.

6. The magnetic resonance apparatus as claimed in claim 1, wherein the patient communication device further comprises a magnetic field sensor.

7. The magnetic resonance apparatus as claimed in claim 1, wherein the at least one communication element comprises a patient call ball.

8. The magnetic resonance apparatus as claimed in claim 1, wherein the at least one communication element comprises a patient microphone.

9. The magnetic resonance apparatus as claimed in claim 1, wherein the controller is further configured to deactivate the at least one communication element while the communication device is positioned within the patient accommodating region and during a receive phase for receiving magnetic resonance signals of a magnetic resonance examination performed using the scanner.

10. The magnetic resonance apparatus as claimed in claim 1, wherein the patient communication device further comprises a fastener configured to selectively position the patient communication device in the patient accommodating region.

11. A method for transmitting at least one notification signal of a patient during a magnetic resonance examination by a magnetic resonance apparatus, the method comprising: detecting, by a communication element of a patient communication device of the magnetic resonance apparatus, an input from the patient located within a patient accommodating region of the magnetic resonance apparatus and generating an input signal corresponding to the detected input, wherein radio-frequency magnetic resonance sequences are radiatable into the patient accommodating region by a radio-frequency antenna unit of the magnetic resonance apparatus; processing, by a controller of the patient communication device, the input signal from the patient to generate a notification signal; and wirelessly transmitting, by a radio-frequency transmitter of the communication element and under control of the controller, the notification signal out of the patient accommodating region.

12. The method as claimed in claim 11, wherein the processing of the input signal comprises signal modulating the input signal.

13. The method as claimed in claim 11, wherein the communication element is activated, by the controller, upon introduction into a magnetic field of the magnetic resonance apparatus generated within the patient accommodating region.

14. The method as claimed in claim 13, further comprising emitting a test signal after activating the communication element.

15. The method as claimed in claim 11, wherein the notification signal is continuously transmitted during a defined period of time.

16. The method as claimed in claim 11, wherein transmission of the notification signal by the radio-frequency transmitter of the communication element is controlled by the controller as a function of a receive phase for receiving magnetic resonance signals during the magnetic resonance examination.

17. The method as claimed in claim 11, wherein transmission of the notification signal by the radio-frequency transmitter of the communication element is controlled by the controller as a function of a magnetic resonance excitation transmit pulse during the magnetic resonance examination.

18. The method as claimed in claim 11, wherein the transmitted notification signal is received via a receive channel of a radio-frequency antenna of the magnetic resonance apparatus.

19. The method as claimed in claim 11, wherein the patient communication device comprises an energy storage device configured to be wirelessly charged during the magnetic resonance examination.

20. A non-transitory computer-readable storage medium with an executable computer program stored thereon, that when executed, instructs a processor to perform steps comprising: detecting, by a communication element of a patient communication device of a magnetic resonance apparatus, an input from a patient located within a patient accommodating region of the magnetic resonance apparatus and generating an input signal corresponding to the detected input, wherein radio-frequency magnetic resonance sequences are radiatable into the patient accommodating region by a radio-frequency antenna unit of the magnetic resonance apparatus; processing, by a controller of the patient communication device, the input signal from the patient to generate a notification signal; and wirelessly transmitting, by a radio-frequency transmitter of the communication element and under control of the controller, the notification signal out of the patient accommodating region.

21. The magnetic resonance apparatus as claimed in claim 1, wherein the radio-frequency transmitter of the at least one communication element includes an antenna with a magnetic loop having a maximum size of 10 mm by 10 mm.

* * * * *